United States Patent [19]

Koide

[11] 4,305,040

[45] Dec. 8, 1981

[54] PHASE DETECTION SYSTEM

[75] Inventor: Hiroshi Koide, Sagamihara, Japan

[73] Assignee: Ricoh Co., Ltd., Tokyo, Japan

[21] Appl. No.: 38,660

[22] Filed: May 14, 1979

[30] Foreign Application Priority Data

May 17, 1978 [JP] Japan ................................. 53-57688

[51] Int. Cl.³ .............................................. H03K 5/26
[52] U.S. Cl. .................................... 328/134; 307/516;
307/528
[58] Field of Search ................ 328/133, 134; 307/232,
307/234

[56] References Cited

U.S. PATENT DOCUMENTS

| 3,430,148 | 2/1969 | Miki | 328/133 |
| 3,588,734 | 6/1971 | Welti | 307/232 X |
| 3,600,690 | 8/1971 | White | 328/133 |
| 3,610,954 | 10/1971 | Treadway | 307/232 |

*Primary Examiner*—John S. Heyman
*Attorney, Agent, or Firm*—Burgess, Ryan and Wayne

[57] ABSTRACT

A phase detection system in which a triangular reference signal which is substantially similar in waveform, frequency and amplitude to an input signal is used and at a time of detection whether the reference and input signal are rising or falling is detected and also whether or not the input signal is greater than an auxiliary or complementary signal derived by subtracting the reference signal from a constant DC signal whose amplitude is equal to a maximum amplitude of the reference signal is detected. Operations are executed based upon the detection results so that an output signal representative of an instantaneous phase difference between the input and reference signals is obtained without any delay in time. The relationships between operands and results in operations are as follows:

(a) when both the reference and input signals are rising simultaneously, the result represents the input signal minus the reference signal;

(b) when the reference and input signals are falling simultaneously, the result represents the reference signal minus the input signal;

(c) when the reference signal is rising while the input signal is falling and (i) if the input signal is greater than the auxiliary or complementary signal, the result represents a shifted signal minus the auxiliary or complementary signal, the shifted signal being obtained by negatively shifting in amplitude the input signal by an amount equal to its amplitude, but (ii) if the input signal is smaller than the complementary signal, the result represents the input signal minus the complementary signal; and (d) when the reference signal is falling while the input signal is rising and (i) if the input signal is greater than the complementary signal, the result represents the complementary signal minus the shifted signal, but (ii) if the input signal is smaller than the complementary signal, the result represents the sum of the input and reference signals.

2 Claims, 26 Drawing Figures

| CONDITIONS | | | OPERATIONS FOR OBTANING OUTPUT VOLTAGE V | | | | |
|---|---|---|---|---|---|---|---|
| FB(R)—1 FB(F)—0 | R(R)—1 R(F)—0 | FB−RC POSITIVE→1 NEGATIVE→0 | FB | R | RC | RI | FBS |
| 1 | 1 | X | 1 | −1 | | | |
| 0 | 0 | X | −1 | 1 | | | |
| 1 | 0 | 1 | | | −1 | | 1 |
| 1 | 0 | 0 | 1 | (1) | | −1 | |
| 0 | 1 | 1 | | | | 1 | −1 |
| 0 | 1 | 0 | −1 | (−1) | | 1 | |

| CONDITIONS | | | OPERATIONS FOR OBTAINING OUTPUT VOLTAGE V | | | | |
|---|---|---|---|---|---|---|---|
| FB(R)—1 FB(F)—0 | R(R)—1 R(F)—0 | FB-RC POSITIVE→1 NEGATIVE→0 | FB | R | RC | RI | FBS |
| 1 | 1 | X | 1 | -1 | | | |
| 0 | 0 | X | -1 | 1 | | | |
| 1 | 0 | 1 | | | -1 | | 1 |
| 1 | 0 | 0 | 1 | (1) | | -1 | |
| 0 | 1 | 1 | | | 1 | | -1 |
| 0 | 1 | 0 | -1 | (-1) | | 1 | |

FIG. 16

| a | b | c | α | β | γ | δ |
|---|---|---|---|---|---|---|
| FB(R)→1, FB(F)→0 | R(R)→1, R(F)→0 | FB→RC, POSITIVE→1, NEGATIVE→0 | AMPLIFIER 7, NONINVERTING→1, INVERTING→0 | AMPLIFIER 9, NONINVERTING→1, INVERTING→0 | SW3, 1→SI, 0→SO | SW4, 1→SI, 0→SO |
| — | — | × | — | ○ | ○ | ○ |
| ○ | ○ | × | ○ | — | ○ | ○ |
| — | ○ | — | — | ○ | — | — |
| — | ○ | ○ | — | — | ○ | ○ |
| ○ | — | — | ○ | — | — | — |
| ○ | — | ○ | ○ | ○ | ○ | ○ |

4,305,040

PHASE DETECTION SYSTEM

BACKGROUND OF THE INVENTION

The present invention relates to a phase detection system which is capable of detecting the difference in phase between two input signals and generating an output signal representative of the detected phase difference instantaneously without any delay in time.

In a prior art phase detection system of the type generating an output voltage representative of a phase difference between two input signals, the input signals are first converted into rectangular waveforms and the rectangular waveform signals are caused to pass through AND and OR gates so as to derive coincidence and noncoincidence signals. The coincidence and noncoincidence signals are smoothed through a low-pass filter so as to obtain an output voltage representative of a phase difference between the input signals. However, this system has the drawback that the phase detection can be made only once for each cycle; that is, the system cannot deliver a continuous phase difference information. In addition the prior art system must include a low-pass filter so that discontinuous phase difference information may be smoothed so that a time corresponding to a time constant of the low-pass filter is needed from an initial state before a correct output voltage can be derived. The prior art system has a further drawback that the time constant of the low-pass filter must be changed in order to detect the phase differences between input signals even when their frequencies vary.

SUMMARY OF THE INVENTION

In view of the above, the primary object of the present invention is to provide a phase detection system which is capable of generating an output voltage representative of phase difference between two input signals continuously and without any delay in time.

Another object of the present invention is to provide a phase detection system which is capable of detecting phase of a wide-band input signal without changing a frequency range.

Briefly stated, the present invention is characterized by the provision of (a) a recurrent triangular waveform reference signal, (b) an input signal which is substantially similar in waveform, frequency and amplitude to the reference signal, (c) a complementary reference signal generating means for subtracting the reference signal from a constant DC signal whose amplitude is equal to a maximum amplitude of the reference signal, thereby deriving a complementary signal of the reference signal, (d) a shifting means for negatively shifting in amplitude the input signal by an amount equal to its amplitude, thereby deriving a shifted signal, (e) detection means for detecting whether the reference and input signals are rising or falling, (f) a comparison means for detecting whether the input signal is greater or smaller than the complementary reference signal, and (g) operation circuit means which delivers an output signal representative of the difference in level between the reference and input signals when the detection means has detected that both said reference and input signals are rising or falling simultaneously, but, when the detection means has detected that the reference signal is rising while the input signal is falling or vice versa, delivers an output signal representative of the difference in level between the complementary reference signal and the shifted signal if the input signal is greater than the complementary reference signal or an output signal representative of the sum in level of the input signal and the reference signal if the input signal is lower than the complementary reference signal.

The above and other objects, effects and features of the present invention will become more apparent from the following description of a preferred embodiment thereof taken in conjunction with the accompanying drawings.

BRIEF DESCRIPTION OF THE DRAWINGS

FIG. 16 is a table used for the explanation of the mode of operation of a decision circuit shown in FIG. 14;

DESCRIPTION OF THE PREFERRED EMBODIMENT

Figure 1:
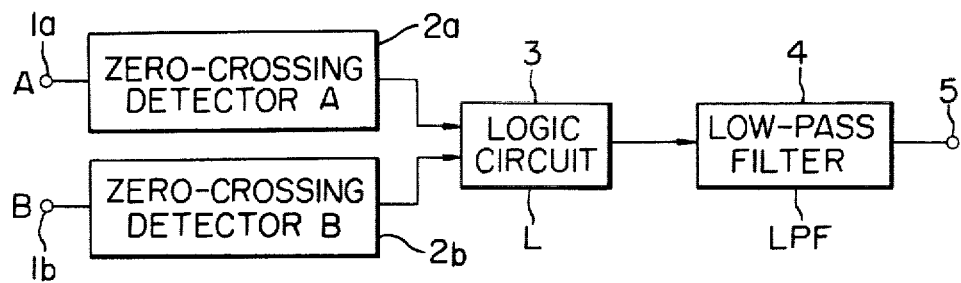
FIG. 1 is a block diagram of a prior art phase detection system.
Figure 2:
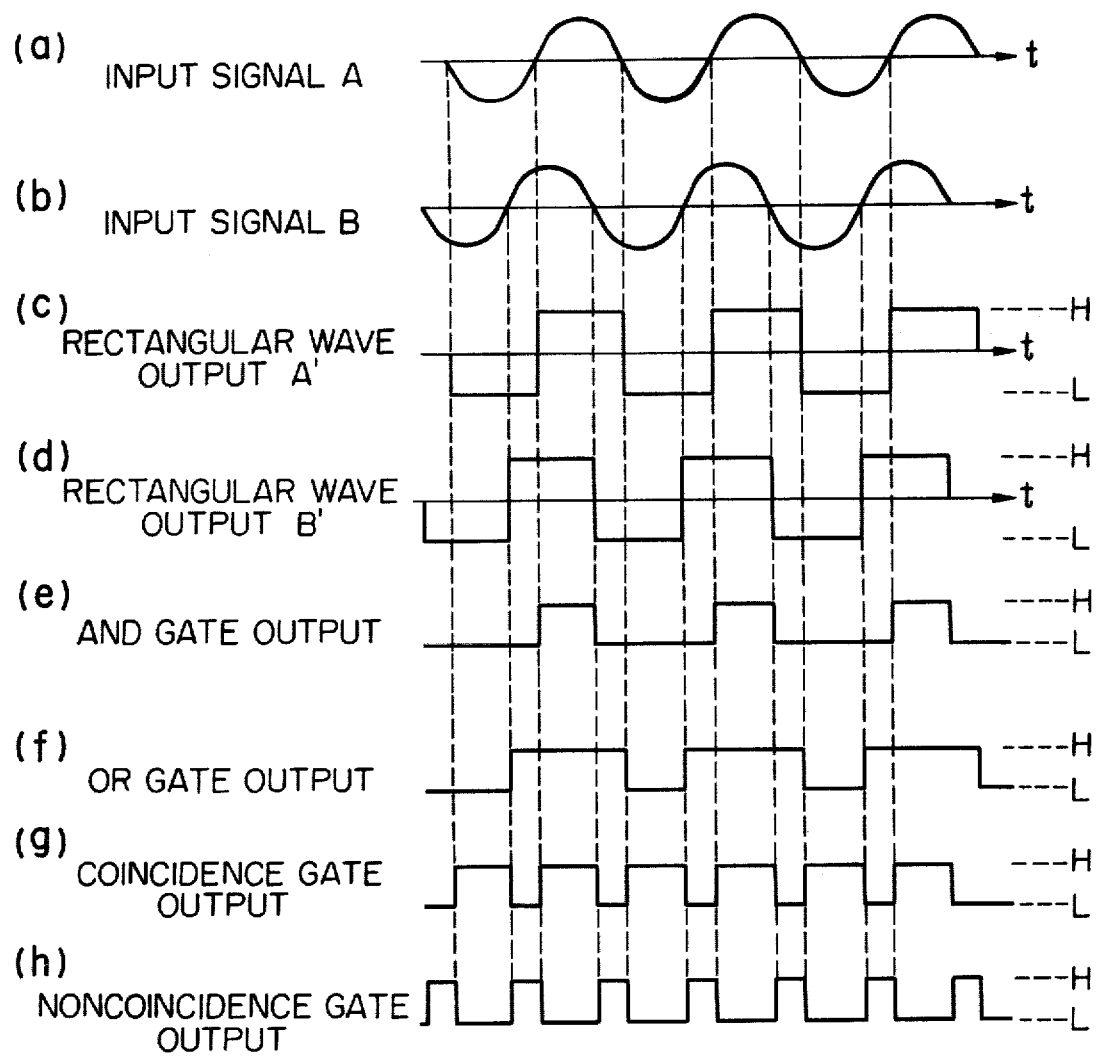
FIG. 2 shows waveforms used for the explanation of the phase detection system shown in FIG. 1.

FIG. 1 shows a prior art phase detection system. A zero-crossing detector $2_a$ converts an input signal applied to an input terminal $1_a$ as shown at (a) in FIG. 2 into a rectangular waveform output A' as shown at (c) in FIG. 2. In like manner, a zero-crossing detector $2_b$ converts an input signal applied to an input terminal $1_b$ as shown at (b) in FIG. 2 into a rectangular waveform output B' as shown at (d) in FIG. 2. These outputs A' and B' are applied to a logic circuit 3 comprising an AND gate, an OR gate, a coincidence gate and a noncoincidence gate. The outputs from these logic circuits are shown at (e) through (h) in FIG. 2. When the output from the coincidence or noncoincidence gate is smoothed by a low-pass filter 4, an output voltage which is in proportion to the phase difference between the input signals A and B is derived at an output terminal 5.

Next the underlying principle of the present invention will be described. Both reference signal REF and an input signal FB are recurrent triangular waveform AC signals which rise substantially linearly to a predetermined high level and then fall substantially linearly to a predetermined low level.

Figure 5:
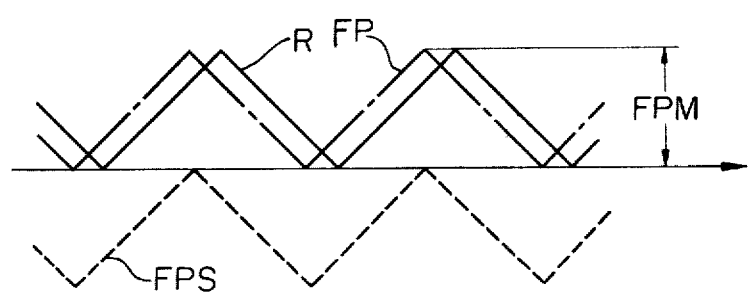
Figure 6:
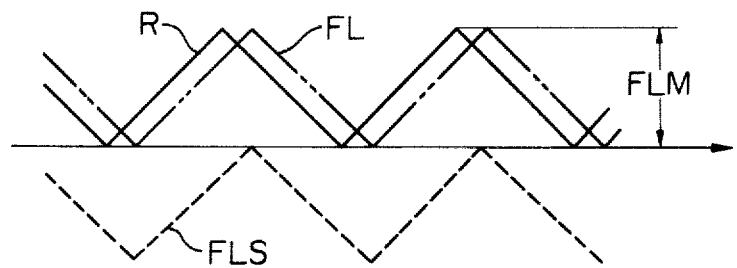

FIG. 5 shows the reference signal REF and the input signal $FB_P$ which leads the reference signal in phase. FIG. 6 shows the reference signal REF and the input signal $FB_L$ which lags behind the reference signal in phase. Referring to FIGS. 5 and 6, the relationships between the reference signal REF and the input signal FB will be analyzed. It is seen that when both the reference signal REF and the input signal FB are rising at a time interval $T_A$ or $T'_A$ or when both the signals are falling simultaneously at a time interval $T_B$ or $T'_B$, the phase difference between them is in proportion to the difference in amplitude. On the other hand when the reference signal REF is rising while the input signal is falling or vice versa as shown during a time interval $T_C$, $T'_C$, $T_D$ or $T'_D$, no signal representative of the phase difference cannot be obtained from the reference and input signals per se. However, as will be described in detail below, when the reference signal REF or the input signal FB is suitably converted into an auxiliary signal, a signal representative of the phase difference between them can be obtained during a time interval $T_C$, $T'_C$, $T_D$ or $T'_D$. Auxiliary signals are designated by $REF_{CMP}$, $REF_{INV}$ and $FB_{SHF}$ which will be described in detail below.

Figure 3:
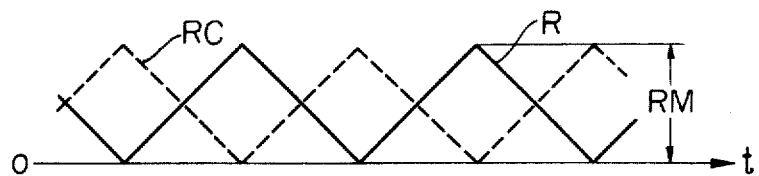
FIGS. 3 through 6 show waveforms of signals used in the explanation of the underlying principle of the present invention.

The signal $REF_{CMP}$ is shown in FIG. 3 by the broken lines and is such that the sum of the reference signal REF and the auxiliary signal $REF_{CMP}$ is equal to the maximum value $|REF|_{max}$ of the reference signal REF. Thus $REF_{CMP} = |REF|_{max} - REF$.

Figure 4:
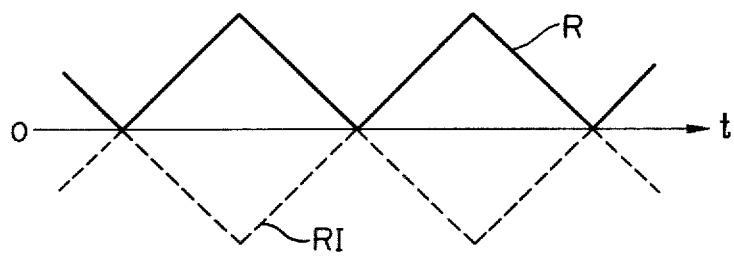

The auxiliary signal $REF_{INV}$ is indicated by the broken lines in FIG. 4 and is obtained by inverting the reference signal REF with respect to the zero level. To put in another way, the auxiliary signal $REF_{INV}$ is derived by passing the reference signal REF through an inverter.

The auxiliary signal $FB_{SHF}$ is indicated by the broken lines in FIG. 5 or 6 and is obtained by negatively shifting the input signal FB by its maximum amplitude $|FB|_{max}$. Thus the auxiliary signal $FB_{SHF}$ is obtained by operating $(FB - |FB|_{max})$.

The present invention relates to a phase detection system in which the auxiliary signals which are correlated with the reference signal or input signal as described above are used to derive a signal representative of a phase difference. That is, according to the present invention, the time interval $T_A$, $T'_A$, $T_B$, $T'_B$, $T_C$, $T'_C$, $T_D$ or $T'_D$ during which the input and reference signals are detected is detected and depending upon the detected time interval, the input signal, the reference signal and one of the three auxiliary signals are selected so that they may be suitably processed so as to obtain an output voltage representative of a phase difference.

Let "phase-REF" denote the phase of the reference signal REF and "phase-FB", the phase of the input signal FB.
Then the following relation is held:

$$V = K[(phase\text{-}FB) - (phase\text{-}REF)]$$

where V is an output voltage, and K is a proportionally constant V/rad or A/rad. The above equation is plotted in FIG. 7, the phase difference being plotted along the abscissa while the voltage in volt, along the ordinate. It is apparent that the output voltage varies depending upon phase differences.

Figure 7:
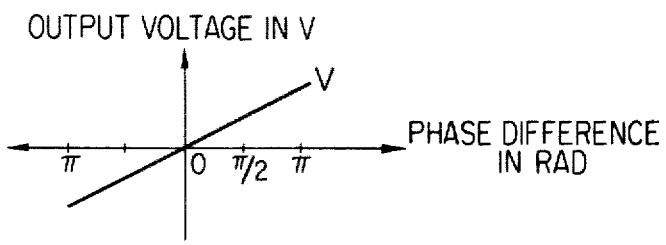
FIG. 7 is a graph showing the relationship between the phase difference and output voltage.
Figure 8:
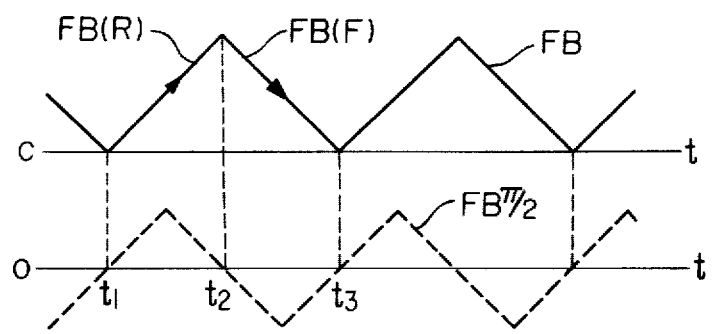
FIGS. 8 through 12 are views used for the explanation of the underlying principle of the present invention.

In summary, according to the underlying principle of the phase detection system of the present invention, the output voltage V as shown in the above equation or in FIG. 7 is obtained. It is not needed to detect whether the output voltage is positive or negative when it is not needed to detect whether the input signal leads or lags behind the reference signal in phase. (The phase detection range is limited between $-\pi$ and $+\pi$.) The time interval T is detected by detecting whether the input signal FB and the reference signal REF are rising or falling and by detecting whether the input signal FB is higher or lower than the auxiliary signal $REF_{CMP}$. To this end, whether the input signal FB is rising or falling must be normally detected. For this purpose, a signal $FB_{\pi/2}$ as shown by the broken lines in FIG. 8 is used. This signal leads the input signal FB by $\pi/2$ and its waveform is symmetrical about the zero reference level.

From $t_1$ to $t_2$ during which the input signal FB is rising, the signal $FB_{\pi/2}$ is positive, but during a time interval from $t_2$ to $t_3$ during which the input signal FB is falling, the signal $FB_{\pi/2}$ is negative. It follows, therefore, whether the input signal FB is rising or falling can be detected by detecting whether the signal $FB_{\pi/2}$ is positive or negative.

Let "FB(R)" denote a time interval (for instance, from $t_1$ to $t_2$) during which the input signal FB is rising and "FB(F)" a time interval (for instance, from $t_2$ to $t_3$) during which the input signal FB is falling. Then the following relationships may be established:

If $FB_{\pi/2} > 0$, then FB(R) and
if $FB_{\pi/2} < 0$, then FB(F). The $FB_{\pi/2}$ signal may be a signal which lags behind the input signal FB by $\pi/2$, but it should be noted that the above relationships are reversed.

Figure 9:
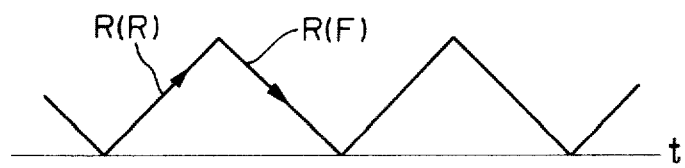

The reference signal must be also detected whether it is rising or falling, but its rising and falling time can be of course predetermined so that no further explanation shall be made. The rising reference signal is designated by REF(R) while the falling reference signal, by REF(F) as shown in FIG. 9.

Whether the input signal FB is higher or lower than the auxiliary signal $REF_{CMP}$ is detected by carrying out the operation of $(FB-REF_{CMP})$.

These detections can be correlated depending upon when the input signal is detected as follows:

(I) When the input signal FB is detected during the time interval $T_A$ or $T'_A$:
FB(R) and REF(R)

(II) When the input signal FB is detected during the time interval $T_B$ or $T'_B$:

FB(F) and REF(F)

(III) When the input signal is detected during the time interval $T_C$:

FB(F), REF(R) and FB−REF$_{CMP}$>0

(IV) When the input signal is detected during the time period T'$_D$:
FB(F), REF(R) and FB−REF$_{CMP}$<0

(V) When the input signal is detected during the time interval T'$_C$:
FB(R), REF(F) and FB−REF$_{CMP}$>0

(VI) When the input signal is detected during the time interval T$_D$:
FB(R), REF(F) and FB−REF$_{CMP}$<0

Next the operations for obtaining the output voltage signal representative of a phase difference will be described in each of (I) through (VI).

Figure 10:
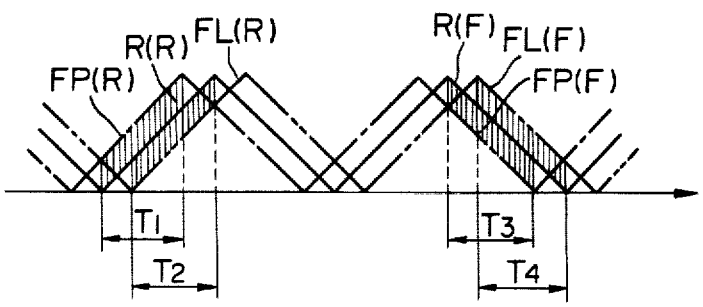

(I) FB(R) and REF(R):

Both the reference signal REF and the input signal EB are detected as rising. Then, as shown at the left in FIG. 10, if the input signal FB is FB$_P$; that is, the signal which leads the reference signal in phase, it lasts during the time interval T$_A$. On the other hand, when the input signal is FB$_L$; that is the input signal which lags behind the reference signal REF in phase, it lasts during the time interval T'$_A$.

During the time interval T$_A$ or T'$_A$, the reference signal REF and the input signal FB are in parallel with each other regardless of their phase relationship so that the phase difference between them is in proportion to the difference in amplitude between them.

Thus the following relationship is established:

$$(phase\text{-}FB) - (phase\text{-}REF) = K'(FB - REF) = K'V$$

where K' is a proportionality constant greater than zero; and FB and REF are amplitudes when detected. This equation may be rewritten as follows:

$$V = 1/K'[(phase\text{-}FB) - (phase\text{-}REF)] = FB - REF$$

The output voltage V is positive when the input signal FB leads the reference signal REF in phase. Thus the output voltage V in proportion to the phase difference can be obtained by subtracting the reference signal from the input signal.

(II) REF(F) and FB(F):

Both the reference signal REF and the input signal FB are detected as falling. Then, as shown at the right in FIG. 10, if the signal FB leads the reference signal REF, the input signal FB$_P$ lasts during T$_B$, but when the input signal lags behind the reference signal, the signal FB$_L$ lasts during the time interval T'$_B$. Therefore, the same relationship as described previously is established:

$$(phase\text{-}FB) - (phase\text{-}REF) = K'(REF - FB) = K'V$$

Hence, $$V = 1/K'[(phase\text{-}FB) - (phase\text{-}REF)] = REF - FB$$

The output voltage V is positive when the input signal leads the reference signal in phase. Thus the output voltage V in proportion to a phase difference is obtained by subtracting the input signal FB from the reference signal REF.

Figure 11:
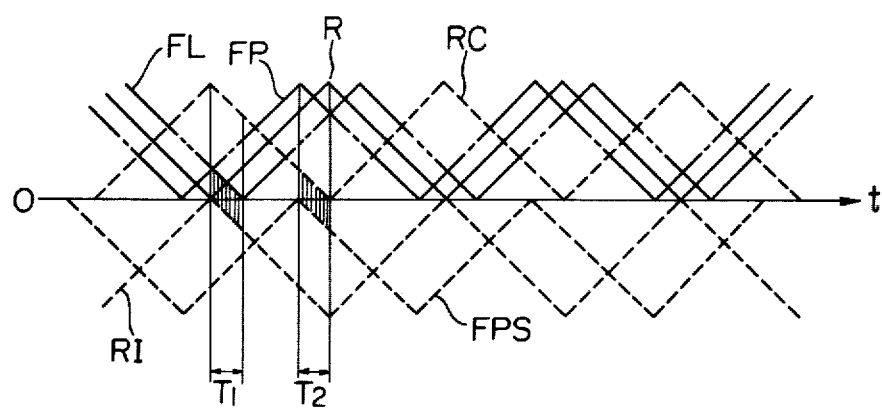

(III) FB(F), REF(R) and FB−REF$_{CMP}$>0:

The input signal FB is detected as falling, the reference signal REF, as rising and the input signal FB, as being greater than the auxiliary signal REF$_{CMP}$. During the time interval T$_C$, FB$_P$ and the reference signal REF cannot be compared with other directly so that the auxiliary signal REF$_{CMP}$ and the auxiliary signal FB$_{PSHF}$ are compared. As shown in FIG. 11, during the time interval T$_C$, the auxiliary signals REF$_{CMP}$ and FB$_{PSHF}$ are in parallel with each other so that the difference in level between them is in proportion to a phase difference between them. Thus $$(phase\text{-}FB) - (phase\text{-}REF) = K'\cdot(REF_{CMP} - FB_{SHF}) = K'V$$

Solving for V, $$V = 1/K'[(phase\text{-}FB) - (phase\text{-}REF)]$$
$$= REF_{CMP} - FB_{SHF}$$

The output voltage V in proportion to a phase difference between the input and reference signals can be obtained by subtracting the auxiliary signal FB$_{SHF}$ from the auxiliary signal REF$_{CMP}$.

(IV) FB(F), REF(R) and FB−REF$_{CMP}$<0:

These conditions are met during the time interval T'$_D$ shown in FIG. 6. The input signal FB$_L$ (lagging in phase) and the reference signal REF cannot be directly compared so that the input signal FB and the auxiliary signal REF$_{INV}$ are compared. They are in parallel with each other during the time interval T'$_C$ shown in FIG. 11 so that the difference in level between them is in proportion to a phase difference between the reference signal REF and the input signal FB$_L$.

Thus, $$(phase\text{-}FB) - (phase\text{-}REF) = K'(REF_{INV} - FB) = K'V$$

Thus, $$V = 1/K'[(phase\text{-}FB) - (phase\text{-}REF)]$$
$$= REF_{INV} - FB.$$

In this case, the auxiliary signal REF$_{INV}$ is negative while the input signal FB is positive so that the output voltage V is negative and consequently the input signal lags behind the reference signal. Since REF$_{INV}$=−REF, the output voltage V can be obtained as follows:

$$V = (-REF) + (-FB)$$

Figure 12:
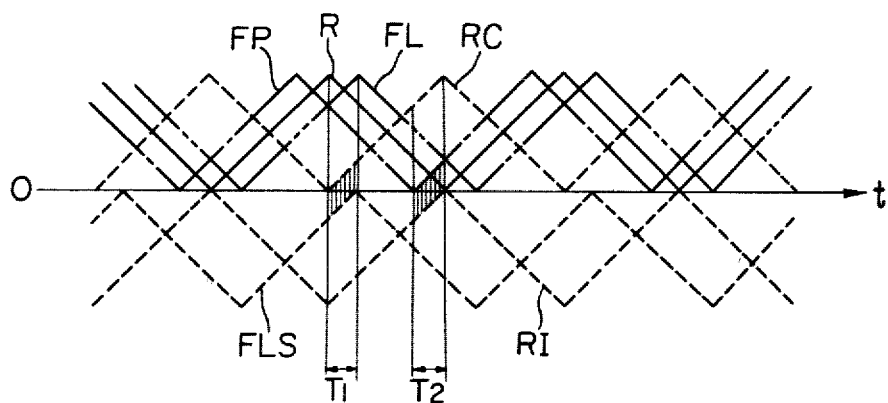

(V) FB(R), REF(F) and FB−REF$_{CMP}$>0:

These conditions are met during the time interval T'$_C$ shown in FIG. 6. The direct comparison between the input signal FB$_L$ and the reference signal REF is again impossible so that the auxiliary signals REF$_{CMP}$ and FB$_{LSHF}$ are compared. As shown in FIG. 12, during the time interval T$_C$, the auxiliary signals REF$_{CMP}$ and FB$_{LSHE}$ are in parallel with each other so that the difference in level between them represents a phase difference between the input and reference signals.

Thus, $$(phase\text{-}FB) - (phase\text{-}REF) = -K'(REF_{CMP} - FB_{SHF})$$

Hence, $$V = 1/K'[(phase\text{-}FB) - (phase\text{-}REF)]$$
$$= FB_{SHF} - REF_{CMP}$$

The output voltage V in proportion to a phase difference between the input and reference signals can be obtained by subtracting the auxiliary signal REF$_{CMP}$ from the auxiliary signal FB$_{SHF}$.

(VI) FB(R), REF(F) and FB−REF$_{CMP}$<0:

These conditions are met during the time interval T$_D$ shown in FIG. 5. Again the direct comparison between the leading input signal FB$_P$ and the reference signal REF is impossible so that the input signal FB$_P$ and the auxiliary signal REF$_{INV}$ are compared with each other. During the time interval T$_D$, they are in parallel with each other so that the difference in level between them is in proportion to a phase difference between the input signal FB$_P$ and the reference signal REF. Thus, $$(phase\text{-}FB) - (phase\text{-}REF) = K'(FB - REF_{INV}) = K'V$$

Hence, $$V = 1/K' [(phase\text{-}FB) - (phase\text{-}REF)]$$
$$= FB - REF_{INV}$$

Since, $REF_{INV} = -REF$
the output voltage V may be obtained as follows:

$$V = FB + REF$$

Figures 13, 15:
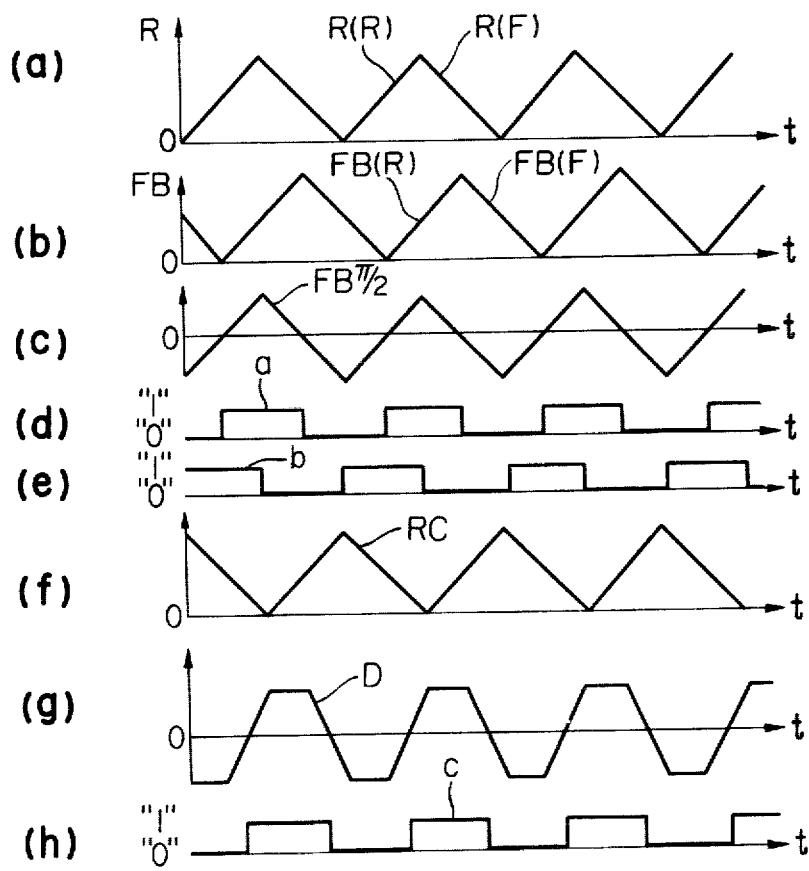
FIG. 13 is a table showing the detected conditions and subsequent operations needed to obtain an output voltage representative of a phase difference detected.
FIG. 15 shows signal waveforms which are used for the explanation of the mode of operation of the first embodiment shown in FIG. 14.

As described in detail hereinbefore, in the phase detection system in accordance with the present invention, an output voltage V which is in proportion to the difference in phase between the input signal FB and the reference signal REF is obtained. The conditions and operations for obtaining the output voltages are tabulated in FIG. 13. In FIG. 13, FB(R) and REF(R) are designated by "1"; FB(F) and REF(F), by "0"; FB−REF$_{CMP}$, by "1" or "0" depending upon whether it is positive or negative and by "X" when the positive-or-negative detection is not needed; and the positive and negative signs of the reference, input and auxiliary signals are denoted by "1" and "−1", respectively. For instance, in case of FB(R) and REF(R) as indicated in the first row, the output voltage V can be obtained by subtracting the reference signal REF from the input signal FB; that is, FB−REF. In like manner, in case of FB(R), REF(F) and FB−REF$_{CMP}$>0 in the third row, the output voltage V is obtained by subtracting the auxiliary signal REF$_{CMP}$ from the auxiliary signal FB$_{SHF}$; that is, V = FB$_{SHF}$ − REF$_{CMP}$.

Instead of the auxiliary signal REF$_{INV}$, −REF may be used as used in the embodiments to be described below. In FIG. 13, −REF is denoted by a parentheses ( ).

Figure 14:
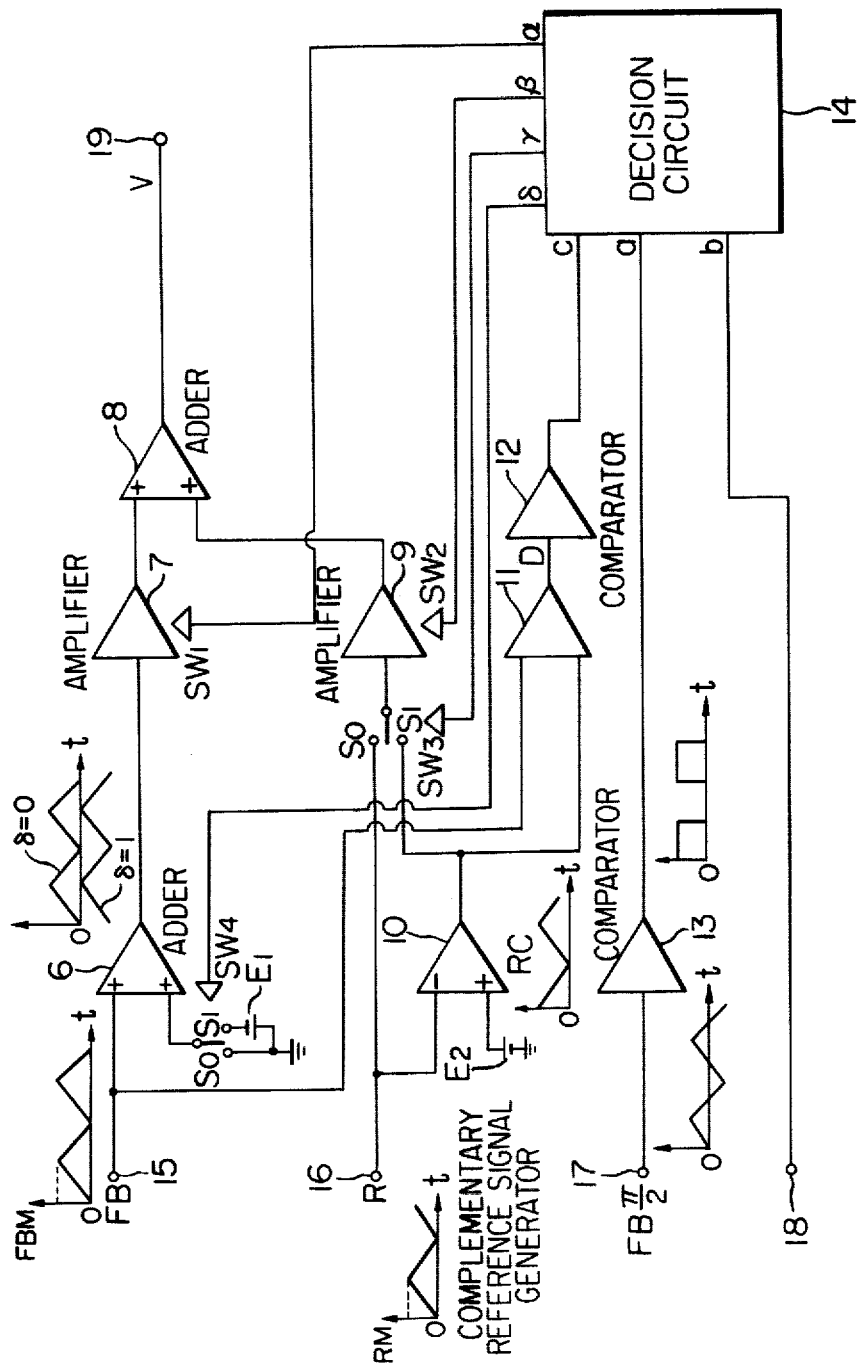
FIG. 14 is a block diagram of a preferred embodiment of a phase detection system in accordance with the present invention.

Referring next to FIGS. 14 and 15, a preferred embodiment of the present invention will be described. An adder 6 receives an input signal FB applied at an input terminal 15 and zero voltage or a voltage E$_1$ which is set to equal to a maximum amplitude |FB|$_{max}$ of the input signal FB and delivers the input signal FB per se or the auxiliary or shifted signal FB$_{SHF}$. A switch SW$_4$ is controlled in response to an output signal δ from a decision circuit 14. That is, when the output signal δ is "0", the switch SW$_4$ connects S$_0$ to the adder 6, but when the output signal δ is "1", the switch SW$_4$ connects a contact S$_1$ to the adder 6.

An amplifier 7 receives as an input the output from the adder 6 and delivers an inverted or noninverted output under the control of a switch SW$_1$ which in turn is controlled in response to an output signal α from the decision circuit 14. That is, when the output signal α is "1" the amplifier 7 functions as a noninverting amplifier, but when the output signal α is "0", the amplifier 7 functions as an inverting amplifier.

A complementary reference signal generator 10 receives a reference signal REF applied at an input terminal 16 and a voltage E$_2$ which is set equal to a maximum amplitude |REF|$_{max}$ of the reference signal REF and delivers an auxiliary signal REF$_{CMP}$ as shown at (f) in FIG. 15.

An amplifier 9 is switched to function as a noninverting amplifier or an inverting amplifier under the control of a switch SW$_2$ which in turn is controlled from an output signal α from the decision circuit 14. That is, when the output signal α is "1", the amplifier 9 functions as a noninverting amplifier, but when the output signal α is "0", the amplifier 9 functions as an inverting amplifier.

A switch SW$_3$ is controlled in response to an output signal γ from the decision circuit 14. That is, when the output signal γ is "1", the switch SW$_3$ connects a contact S$_1$ to the amplifier 9, but when the output signal γ is "0", the switch SW$_3$ connects a contact S$_1$ to the amplifier 9. As a result, when the output signal γ is "1", the auxiliary or complementary signal REF$_{CMP}$ is applied to the amplifier 9, but when the output signal γ is "0", the reference signal is applied to the amplifier 9.

A subtractor 11 receives the auxiliary or complementary signal REF$_{CMP}$ and the input signal FB and delivers a signal D(=FB−REF$_{CMP}$) as shown at (g) in FIG. 15.

A comparator 12 receives the output D from the subtractor 11 and detects whether the signal D is positive or negative and delivers an output signal c as indicated at (h) in FIG. 15. That is, when D>0, c="1", but when D<0, c="0".

A comparator 13 receives a signal FB$_{\pi/2}$ applied at an input terminal 17 and detects whether the input signal FB$_{\pi/2}$ is positive or negative and subsequently whether the input signal FB is rising or falling. As shown at (d) in FIG. 15, it delivers an output signal a which is "1" when FB$_{\pi/2}$>0 but is "0" when FB$_{\pi/2}$<0.

The decision circuit 14 receives input signals a, b and c as shown at (d), (e) and (f), respectively, in FIG. 15 and executes the following operations:

$$\alpha = a$$

$$\beta = \bar{a} \cdot c + b\bar{c}$$

$$\gamma = \delta = c(a \oplus b),$$

where ⊕ denotes an exclusive-OR operator.

Logic circuits for carrying out such operations as described above will be described in detail below.

The correlations among the input signals a, b and c and the output signals or results α, β, γ and δ are tabulated as shown in FIG. 16.

Next referring still FIGS. 13, 14, 15 and 16, the mode of operation of the first embodiment will be described.

(I) FB(R) and REF(R):

In this case, a=1 and b=1. As a result, α=1, β=γ=δ=0. Since δ=0, the adder 6 delivers the input signal FB per se to the amplifier 7. Since α=1, the amplifier 7 functions as the noninverting amplifier so that it delivers the input signal FB to one input terminal of an adder 8. Since $\gamma = 0$, the reference signal REF is applied to the amplifier 9 which functions as the inverting amplifier so that it delivers ($-$REF) to the other input terminal of the adder 8. As a result the adder 8 delivers the output signal V=FB$-$REF.

(II) FB(F) and REF(F):

In this case, a=b=0. As a result, $\beta = 1$ and $\alpha = \gamma = \delta = 0$. Since $\delta = 0$, the adder 6 delivers the input signal FB to the amplifier 7. Since $\alpha = 0$, the amplifier 7 functions as the inverting amplifier so that it delivers the inverted input signal $-$FB to one input terminal of the adder 8. Since $\gamma = 0$, the reference signal REF is applied to the amplifier 9. Since $\beta = 1$, the amplifier 9 functions as the noninverting amplifier so that it delivers the reference signal REF to the other input terminal of the adder 8. The adder 8 then delivers the output signal V=REF$-$FB.

(III) FB(F), REF(R) and FB$-$REF$_{CMP}$>0:

In this case, b=c=1 and a=0. As a result, $\alpha = 0$ and $\beta = \gamma = \delta = 1$. Since $\delta = 1$, the adder 6 delivers the auxiliary signal FB$_{SHF}$ to the amplifier 7. Since $\alpha = 0$, the amplifier 7 functions as the inverting amplifier so that it delivers the inverted auxiliary signal $-$FB$_{SHF}$ to one input terminal of the adder 8. Since $\gamma = 1$, the auxiliary or complementary signal REF$_{CMP}$ is applied to the amplifier 9. Since $\beta = 1$, the amplifier 9 delivers the auxiliary or complementary signal REF$_{CMP}$ per se to the other input terminal of the adder 8. Then the adder 8 delivers the output voltage V=REF$_{CMP}$$-$FB$_{SHF}$.

(IV) FB(F), REF(R) and FB$-$REF$_{CMP}$<0:

In this case, b=1 and a=c=0. As a result, $\alpha = \beta = \gamma = \delta = 0$. Since $\gamma = 0$, the adder 6 delivers the input signal FB to the amplifier 7. Since $\alpha = 0$, the amplifier delivers the inverted input signal ($-$FB) to one input terminal of the adder 8. Since $\gamma = 0$, the reference signal REF is applied to the amplifier 9. Since $\beta = 0$, the amplifier delivers the inverted reference signal $-$REF to the other input terminal of the adder 8. As a result, the adder 8 delivers the output voltage V=($-$FB)+($-$RF).

(V) FB(R), REF(F) and FB$-$REF$_{CMP}$>0:

In this case, b=0 and a=c=1. As a result, $\beta = 0$ and $\alpha = \gamma = \delta = 1$. Since $\delta = 1$, the adder 6 delivers the auxiliary or shifted signal FB$_{SHF}$ to the amplifier 7. Since $\alpha = 1$, the amplifier 7 functions as the noninverting amplifier so that it delivers the auxiliary or shifted input signal FB$_{SHF}$ to one input terminal of the adder 8. Since $\gamma = 1$, the auxiliary or complementary reference signal REF$_{CMP}$ is added to the amplifier 9. Since $\beta = 0$, the amplifier 9 delivers the inverted auxiliary signal $-$REF$_{CMP}$ to the other input terminal of the adder 8. Then the adder 8 delivers the output voltage V=FB$_{SHF}$$-$REF$_{CMP}$.

(VI) FB(R), REF(F) and FB$-$REF$_{CMP}$<0:

In this case, a=1 and b=c=0. As a result, $\alpha = \beta = 1$ and $\gamma = \delta = 0$. Since $\delta = 0$, the adder 6 delivers the input signal FB to the amplifier 7. Since $\alpha = 1$, the amplifier 7 functions as the noninverting amplifier so that it delivers the input signal FB to one input terminal of the adder 8. Since $\gamma = 0$, the reference signal REF is applied to the amplifier 9. Since $\beta = 1$, the amplifier 9 functions as the noninverting amplifier so that it delivers the reference signal REF to the other input terminal of the adder 8. Then the adder 8 delivers the output voltage V=FB+REF.

Figure 17:
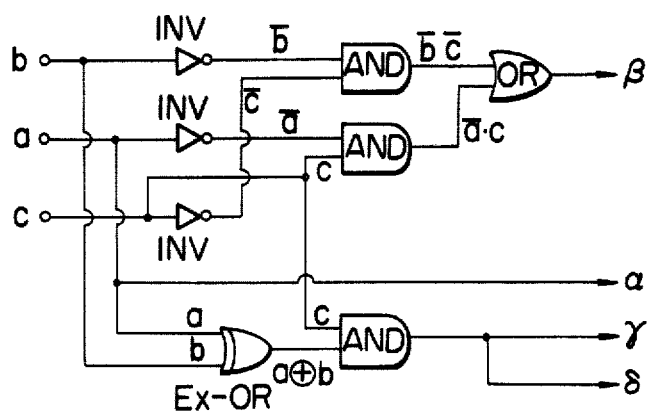
FIG. 17 is a detailed diagram of the decision circuit.

Next referring to FIG. 17, the decision circuit 14 will be described in more detail. In FIG. 17 INV denotes an inverter; AND, an AND gate; OR, an OR gate; and Ex-OR, an exclusive-OR gate. The decision circuit 14 receives the input signals a, b and c, executes the operations and delivers the output signals $\alpha = a$, $\beta = \bar{a}\,c + \bar{b}\,\bar{c}$ and $\gamma = \delta = c\,(a \oplus b)$ as shown in FIG. 16.

Figure 18:
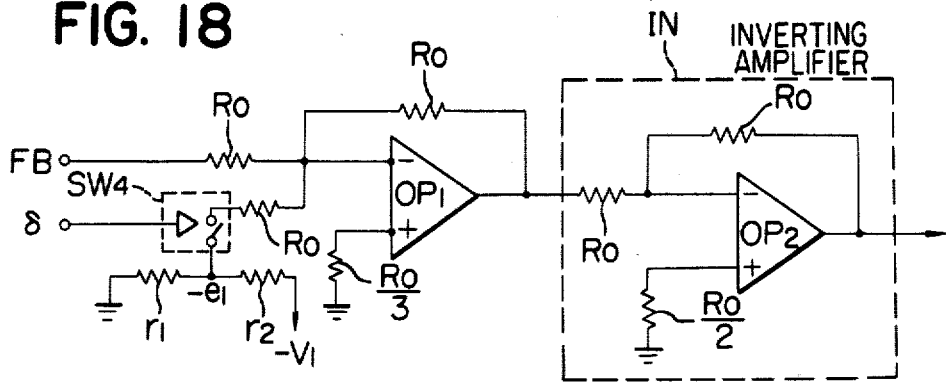
FIG. 18 is a detailed circuit diagram of an adder 6 shown in FIG. 14.

The adder 6 is shown in detail in FIG. 18. The switch SW$_4$ comprises an analog switch. When the switch SW$_4$ is turned on, a voltage $-$V$_1$ is divided by resistors r$_1$ and r$_2$ and a divided voltage $-$e$_1$ (e$_1$=|FB|$_{max}$) is applied to an adder circuit comprising an operational amplifier OP$_1$, three resistors R$_0$ and a resistor R$_0$/3. The resistor R$_0$ has by far a greater value than the resistors r$_1$ and r$_2$. The analog switch SW$_4$ is turned off when $\delta = 0$, but is turned on when $\delta = 1$. An inverting amplifier IN may be eliminated when the switch SW$_1$ shown in FIG. 14 is so arranged that when $\alpha = 1$, the amplifier 7 functions as an inverting amplifier while when $\alpha = 0$, it functions as a noninverting amplifier.

Figure 19:
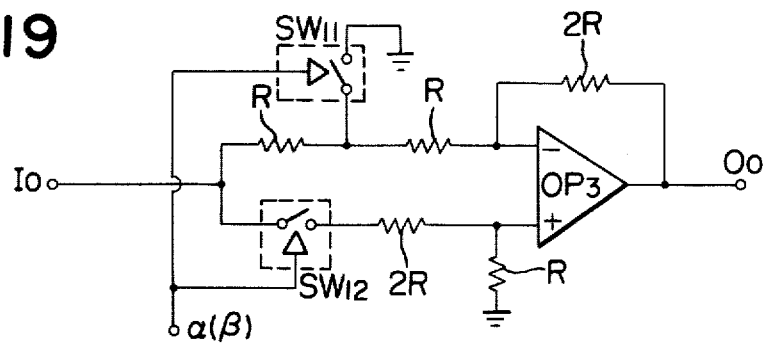
FIG. 19 is a detailed circuit diagram of an amplifier shown in FIG. 14.

The amplifier is shown in detail in FIG. 19. Analog switches SW$_{11}$ and SW$_{12}$ correspond to the switch SW$_1$ or SW$_2$ shown in FIG. 14 and are turned on when $\alpha$ and $\beta$ is "1" and turned off when $\alpha$ or $\beta$ = "0".

Figure 20:
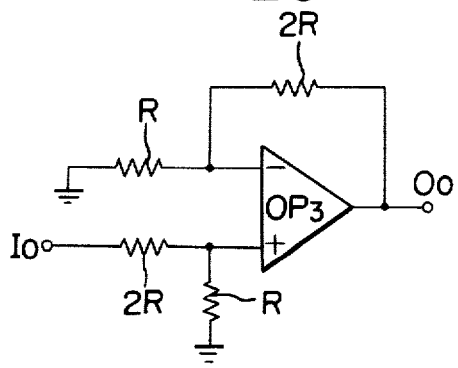
FIG. 20 is an equivalent circuit diagram when the amplifier shown in FIG. 19 operates as a noninverting amplifier.
Figure 21:
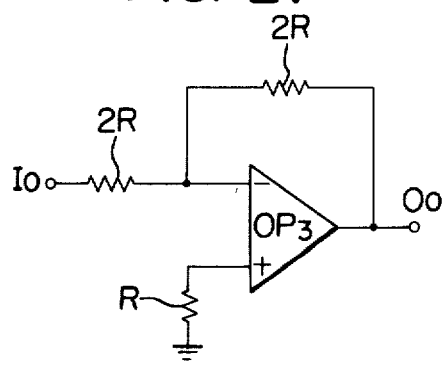
FIG. 21 is an equivalent circuit diagram when the amplifier shown in FIG. 19 operates as an inverting amplifier.

In FIG. 20 is shown an equivalent circuit of the amplifier 7 or 9 when $\alpha$ or $\beta$ = "1" and in FIG. 20 is shown an equivalent circuit thereof when $\alpha$ or $\beta$ = "0". In FIGS. 20 and 21, I$_0$ denotes an input and O$_0$, an output. From FIGS. 20 and 21, the gain of the amplifier 7 or 9 can be obtained as follows: The gain A$_0$ of the circuit shown in FIG. 20 when $\alpha$ and $\beta$ = "1" is $$A_0 = O_0/I_0 = R/3R(1+2R/R) = 1$$

The gain A'$_0$ of the circuit 21 when $\alpha$ or $\beta$ = "0" is $$A'_0 = O_0/I_0 = 2R/2R/ = 1$$

Thus the gain of the amplifier 7 or 9 is always equal to unity regardless of its inverting or noninverting mode.

Figure 22:
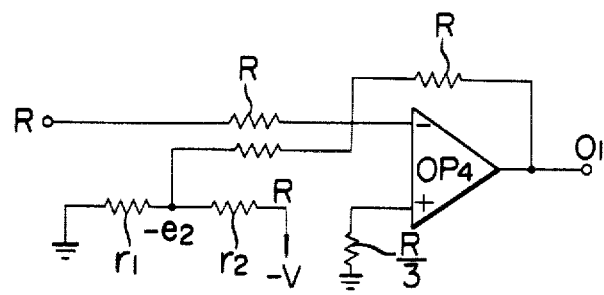
FIG. 22 is a detailed circuit diagram of a complementary reference signal generator shown in FIG. 14.

In FIG. 22 is shown in detail the complementary reference signal generator 10. An adder circuit comprises an operational amplifier OP$_4$, three resistors R and a resistor R/3 and receives the reference signal REF and a voltage $-$e$_2$ (e$_2$=|REF|$_{max}$) obtained by dividing a voltage $-$V by resistors r$_1$ and r$_2$. It delivers an output 0$_1$ = $-$(REF$-$e$_2$) = |REF|$_{max}$$-$REF; that is, the complementary REF$_{CMP}$ of the reference signal REF. The value of the resistors R is by far greater than that of the resistor r$_1$ or r$_2$; that is, R>>r$_1$ or r$_2$.

Figure 23:
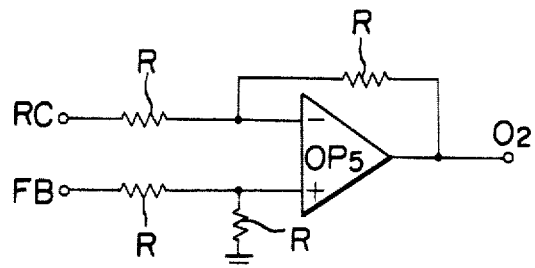
FIG. 23 is a detailed circuit diagram of a subtractor shown in FIG. 14.

In FIG. 23 is shown in detail the subtractor 11. The input signal FB is applied through a resistor R to a positive (+) input terminal of an operational amplifier OP$_5$ and the auxiliary or complementary reference signal REF$_{CMP}$ is applied through a resistor R to a negative ($-$) input terminal. The subtractor 11 delivers the output FB$-$REF$_{CMP}$.

Figure 24:
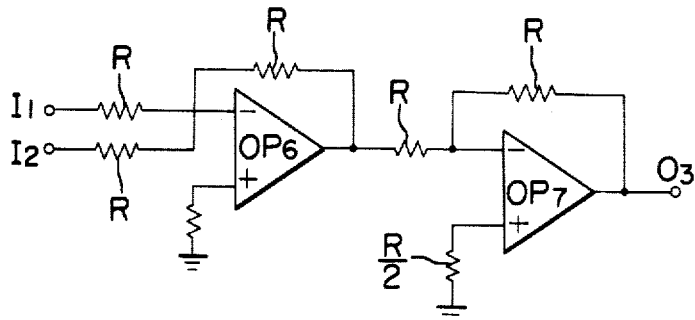
FIG. 24 is a detailed circuit diagram of an adder 8 shown in FIG. 14.

In FIG. 24 is shown in detail the adder 8. An operational amplifier OP$_7$ delivers an output signal $$O_3 = I_1 + I_2$$

where I$_1$ and I$_2$ are inputs to an adder circuit.

Figure 25:
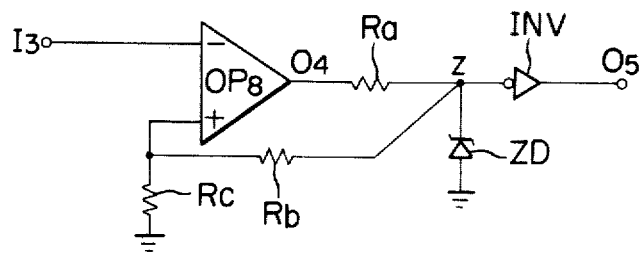
FIG. 25 is a detailed circuit diagram of a comparator shown in FIG. 14.
Figure 26:
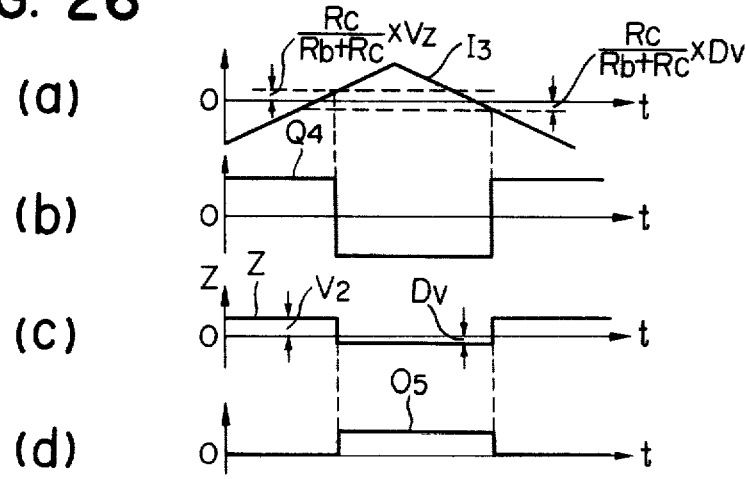
FIG. 26 shows waveforms used for the explanation of the mode of operation thereof.

In FIG. 25 is shown in detail the comparator 12. An operational amplifier OP$_8$, a zener diode ZD and an inverter INV constitute a hysteresis comparator. The operational amplifier OP$_8$ receives at its negative ($-$) input terminal an input signal I$_3$ and delivers an output signal O$_4$. The inverter INV receives an input signal Z and delivers an output signal O$_5$. These input and output signals are shown at (a) through (d) in FIG. 26, respectively, where $V_Z$ denotes a zener voltage and $D_V$, a forward voltage of the zener diode ZD.

In summary, the phase detection system in accordance with the present invention is capable of instantaneously generating an output voltage in proportion to a phase difference between a reference signal REF and an input signal FB without any delay. Therefore it can always deliver an output signal representative of the phase difference which changes momentarily while the prior art phase detection systems can deliver an output signal only after an input signal has elapsed one period. In addition, without changing a range, it is possible to detect phase differences for a wide-band signal.

As a result, when the phase detection system of the present invention is used in a linear-motor driving circuit, the speed of a linear motor can be gradually varied.

So far the preferred embodiment of the present invention has been described in detail in conjunction with a triangular waveform input signal, but it is to be understood that the present invention may be equally applied to any signal with a waveform similar to a triangle such as a sinusoidal waveform even though some negligible errors may result. So far, $|FB|_{max}=|REF|_{max}$ and the input and reference signals FB and REF have been described as having the same frequency, but these conditions may be relaxed if the output voltage V may not be in exact proportion to the difference in phase between the input and reference signals FB and REF; that is, if the output voltage V may have some error.

What is claimed is:

1. A phase detection system characterized by the provision of
   (a) a reference signal which is substantially triangular in waveform,
   (b) an input signal which is substantially similar in waveform, frequency and amplitude to said reference signal,
   (c) a complementary reference signal generating means for subtracting said reference signal from a constant DC signal whose amplitude is equal to a maximum amplitude of said reference signal, thereby deriving a complementary reference signal,
   (d) a shifting means for negatively shifting said input signal by an amount equal to its amplitude, thereby deriving a shifted signal,
   (e) detection means for detecting whether said reference signal and said input signal are rising or falling,
   (f) a comparison means for detecting whether said input signal is greater or smaller than said complementary reference signal, and
   (g) operation means which
      delivers an output signal representative of the difference in level between said reference and input signals when said detection means has detected
      (i) that both said reference and input signal are rising or falling simultaneously, but, when said detection means has detected (ii) that said reference signal is rising while said input signal is falling or vice versa and
      if said input signal is greater than said complementary reference signal,
      said operation means delivers an output signal representative of the difference in level between said complementary reference signal and said shifted signal,
      but if said input signal is smaller than said complementary reference signal,
      said operation means delivers an output signal representative of the sum in level of said input signal and said reference signal.

2. A phase detection system as set forth in claim 1 further characterized in that
   said operation means delivers
   (a) an output representative of the difference in level between said reference and input signals that is, the input signal minus the reference signal when they are rising simultaneously,
   (b) an output representative of the difference in level between said reference and input signals; that is, the reference signal minus the input signal when said reference and input signals are falling simultaneously,
   (c) the following output signals when said reference signal is rising while said input signal is falling;
      (i) an output signal representative of the difference in level between the complementary reference signal and said shifted signal; that is, the shifted signal minus the complementary reference signal when the input signal is greater than the complementary reference signal, but
      (ii) an output signal representative of the difference in level between the reference signal and said input signal; that is, the input signal minus the reference signal if the input signal is smaller than the complementary reference signal, and
   (d) the following output signals when said reference signal is falling while said input signal is rising
      (i) an output signal representative of the difference in level between the complementary reference signal and the shifted signal; that is, the complementary reference signal minus the shifted signal if said input signal is greater than said complementary reference signal, but
      (ii) an output signal representative of the sum in level between the input and reference signal; that is, the reference signal plus the input signal if the input signal is smaller than the complementary reference signal.

* * * * *